(12) United States Patent
Corsi

(10) Patent No.: US 7,009,549 B1
(45) Date of Patent: Mar. 7, 2006

(54) SWITCHED-CAPACITOR CIRCUIT WITH SCALED REFERENCE VOLTAGE

(75) Inventor: Marco Corsi, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/026,673

(22) Filed: Dec. 30, 2004

(51) Int. Cl.
    *H03M 1/38* (2006.01)
(52) U.S. Cl. .................. 341/161; 341/118; 341/172
(58) Field of Classification Search ............. 341/161, 341/118, 172
    See application file for complete search history.

(56) References Cited

U.S. PATENT DOCUMENTS

| | | | |
|---|---|---|---|
| 6,249,240 B1 | 6/2001 | Ballaouar | |
| 6,909,391 B1 * | 6/2005 | Rossi | 341/161 |
| 6,909,393 B1 * | 6/2005 | Atriss et al. | 341/163 |

OTHER PUBLICATIONS

Abo et al., "A 1.5 V, 10-bit, 14.3-MS/s CMOS Pipeline Analog-to-Digital Converter", J. Solid State Circ., vol. 34, No. 5 (IEEE, May 1999), pp. 599-606.

* cited by examiner

Primary Examiner—Peguy JeanPierre
Assistant Examiner—Lam T. Mai
(74) Attorney, Agent, or Firm—W. Daniel Swayze, Jr.; W. James Brady; Frederick J. Telecky, Jr.

(57) ABSTRACT

A pipelined analog-to-digital converter (ADC) (30) with improved precision is disclosed. The pipelined ADC (30) includes a sequence of stages (20), each of which includes a sample-and-hold circuit (22), an analog-to-digital converter (23), and the functions of a digital-to-analog converter (DAC) (25), an adder (24), and a gain stage (27) at which a residue signal (RES) is generated for application to the next stage (20) in the sequence. A multiplying DAC (28) performs the functions of the DAC (25), adder (24), and gain stage (27) in the stage (20), and is based on an operational amplifier (29). Sample capacitors (C10, C20) and reference capacitors ($C12_2$, $C22_2$) receive the analog input from the sample-and-hold circuit (22) in a sample phase; parallel capacitors ($C12_1$, $C22_1$) are provided to maintain constant circuit gain. Extended reference voltages ($V_{REFPX}$, $V_{REFNX}$) at levels that exceed the output range ($V_0+$, $V_0-$) of the operational amplifier (29) are applied to the reference capacitors, in response to the digital output of the analog-to-digital converter (23) in its stage (20). The reference capacitors (C12, C22) are scaled according to the extent to which the extended reference voltages ($V_{REFPX}$, $V_{REFNX}$) exceed the op amp output levels ($V_0+$, $V_0-$). The effects of noise on the reference voltages ($V_{REFPX}$, $V_{REFNX}$) on the residue signal (RES) are thus greatly reduced.

20 Claims, 7 Drawing Sheets

SWITCHED-CAPACITOR CIRCUIT WITH SCALED REFERENCE VOLTAGE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of electronic circuits, and is more specifically directed to switched-capacitor circuits such as useful in data converter circuits.

Despite the continuing trend toward the digitization of electronic circuits and systems over recent years, modern electronic systems must still often process and generate electrical signals in the analog domain. For example, analog signals are transmitted and received in many modern communications technologies, and analog signals are used in instrumentation and control systems. Data converter circuits are therefore required to provide an interface between the digital and analog domains, especially in those systems in which digital signal processing is applied. As is fundamental in the art, analog-to-digital converters (ADCs) convert analog measurements or signals into the digital data to which digital signal processing is applied. Conversely, digital-to-analog converters (DACs) convert digital data into analog signals for transmission or actuation of a physical device.

Advances in modern data converter circuits have resulted in extremely precise, high-speed, data conversion functions. For example, ADCs with resolutions of from sixteen to twenty-two bits, at sample rates in the thousands of samples per second, are now available from Texas Instruments Incorporated. This level of performance requires not only very rapid switching speeds, but also an extremely high degree of precision. Accordingly, difficult tradeoffs are involved in the design of modern data converter circuits.

A well-known type of analog-to-digital converter is the so-called pipelined ADC, as will now be described relative to FIG. 1. In this example, the pipelined ADC has three stages $10_0$ through $10_2$, each of which will generate one or more digital bits corresponding to the amplitude of an analog input signal. First, or most significant, pipeline stage $10_0$ receives the input analog signal at terminal ANALOG_IN, generates one or more digital bits on output D0, and also generates an analog residue that is presented to the next pipeline stage $10_1$. Pipeline stage $10_1$ similarly generates one or more digital bits on output D1 from this residue from stage $10_1$, and generates an analog residue that is forwarded to the next pipeline stage $10_2$. Stage $10_2$ generates one or more digital bits on output D2 corresponding to the residue from stage $10_1$, and forwards a residue to a next stage (not shown) if present. Digital outputs D0 through D2 are connected to digital correction function 11, which combine the digital bits from ADCs 3 into the eventual digital output on lines DIGITAL_OUT.

Pipeline stages $10_0$ through $10_2$ are similarly constructed as one another. In this conventional construction, with reference to stage $10_0$ by way of example, the input to the stage is connected to the input of sample-and-hold circuit 2, which is clocked to receive and store an analog voltage corresponding to the voltage at that input. The output of sample-and-hold 2 is applied to the input of analog-to-digital converter (ADC) 3, and also to an input of analog adder 4. ADC 3 generates a digital output consisting of one or more bits on output line D0; this digital output is also applied to the input of digital-to-analog converter (DAC) 5. In many popular cases, the pipelined ADC generates "1.5" bits per stage 10, referring to each ADC 3 generating a two bit output, but with some of the bits digitally combined by digital correction function 11 to effect digital error correction, as known in the art. DAC 5 also receives this digital value, and generates an analog signal corresponding to a comparison of this digital value against one or more reference voltages (generated by bandgap reference circuit 6 in this example). This analog signal is subtracted from the analog input signal, by adder 4, to generate a residue signal to be forwarded to, and digitized by, the next stage $10_1$. This residue amounts to the difference between the input analog signal itself and an analog signal corresponding to the digital "integer" approximating the amplitude of the input analog signal; the next stage $10_1$ thus digitizes this residue value to produce the next-most significant digital bit or bits. Gain stage 7 "gains up" the residue from adder 4, so that the residue analog signal will vary over the full input dynamic range of next stage $10_1$, to avoid loss of sensitivity from stage to stage.

As is well known in the art, the digital data presented at digital output outputs D0 through D2 are combined by digital correction function 11 into a digital output word that approximates the amplitude of the analog input signal. This combining can account for some error in the digitization of each stage $10_0$ through $10_2$, and as such the necessary precision of ADCs 3 in each of stages $10_0$ through $10_2$ can be relatively loose. However, DACs 5 must be quite precise, as the output of DACs 5 derive the residue signal that is passed along to the next stage, and is amplified by gain stage 7. Any error produced by a given DAC 5 thus directly appears in the output digital signal. Accordingly, the precision of DACs 5 is a limiting factor in the accuracy and performance of the pipelined ADC.

FIG. 2 illustrates an example of a conventional switched-capacitor circuit 8, which effects the functions of DAC 5, adder, 4, and gain stage 7 in one of stages 10 in the conventional pipelined ADC of FIG. 1. Of course, many variations in the construction of circuit 8 are known. This type of switched-capacitor circuit is commonly referred to in the art as a "multiplying DAC", or "MDAC", in that the circuit generates an analog residue signal corresponding to an input analog level relative to a digital input, and that is multiplied by a gain value. In this example, assuming that each pipeline stage 10 produces 1 bit or 1.5 bits per stage (the case of 1.5 bits per stage referring to the number of output bits at DIGITAL_OUT being 1.5 times the number of stages 10), the output voltage $V_{out}$ is intended to be twice the difference between input voltage $V_{in}$ from sample-and-hold circuit 2, and a selected reference voltage $V_{REFP}$ or $V_{REFN}$, where the reference voltages $V_{REFP}$ and $V_{REFN}$ define the full scale voltage between adjacent digital levels, and correspond to the output voltage swing of op amp 9. The reference voltage $V_{REFP}$ is selected if the input voltage $V_{in}$ was digitized to a "1" bit, while the reference voltage $V_{REFN}$ is selected if the input voltage $V_{in}$ was digitized to a "0" bit. Switched-capacitor circuit 8 of FIG. 2 includes one pair of capacitors $C_A$, $C_B$, which corresponds to the case in which one bit (or 1.5 bits, in which case only the MSB is forwarded to DAC 5) of digital resolution is provided by ADC 3. As known in the art, if ADC 3 provides a multiple bit output (up to as many as five bits, in some modern pipelined ADCs), additional capacitor pairs that are configured and operate in the same fashion as capacitors $C_A$, $C_B$ will be provided in circuit 8, with the number of capacitor pairs that are switched into the circuit corresponding to the digital output of ADC 3.

As evident from FIG. 1, input voltage $V_{in}$ is the voltage output from sample-and-hold 2 within the same stage 10 in which DAC 5 resides. Referring back to FIG. 2, pass switches S1, S2 are each connected between this input voltage $V_{in}$ and a first plate of respective capacitors $C_A$, $C_B$. Capacitors $C_A$, $C_B$ have the same capacitance, in this example. The other plates of capacitors $C_A$, $C_B$ are connected together, and to an inverting input of operational amplifier ("op amp") 9; these capacitor plates are also connected to ground via pass switch S6. The first plate of capacitor $C_A$ is connected via MDAC switch block 11 to receive one of the reference voltages $V_{REFP}$ or $V_{REFN}$ or to ground, via a corresponding one of switches SP, SN, SG, respectively, in response to the digital value from ADC 3. The first plate of the capacitor CB is connected to the output of op amp 9 via pass switch S4. Pass switches S1, S2, and S6 are clocked to be closed during clock phase $\Phi_1$, while pass switch S4 and the appropriate switch SP, SN, SG in MDAC switch block 11 are closed during clock phase $\Phi_2$. Clock phases $\Phi_1$, $\Phi_2$ are non-overlapping clock phases; indeed, clock phase $\Phi_2$ may be simply clock phase $\Phi_1$, logically inverted.

In operation during "sample" clock phase $\Phi_1$, pass switches S1, S2, and S6 are closed, pass switch S4 is open, and all of MDAC switches SP, SN, SG are also open. Pass switches S1, S2 connect the input voltage $V_{in}$ to capacitors $C_A$, $C_B$; the opposite plates of capacitors $C_A$, $C_B$ are connected to ground by the closed state of switch S6. Capacitors $C_A$, $C_B$ thus both charge to input voltage $V_{in}$ during this clock phase. In "amplify" clock phase $\Phi_2$, pass switches S1, S2, and S6 are open, and pass switch S4, and the selected one of reference voltage switches SP, SN, SG, are closed. During this clock phase, the capacitor $C_B$ becomes the feedback capacitor, and capacitor $C_A$ receives the selected reference voltage $V_{REFP}$ or $V_{REFN}$, as the case may be. To the extent that the selected reference voltage differs from input voltage $V_{in}$, charge sharing between capacitors $C_A$ and $C_B$ occurs. One can analyze the circuit by equating the sum of the charge on capacitors $C_A$ and $C_B$ during clock phase $\Phi_1$ with the sum of the charge on these capacitors during the next clock phase $\Phi_2$. In other words:

$$-V_{in}C_A - V_{in}C_B = -V_{out}C_B - V_{REFP/REFN}C_A \quad (1)$$

where reference voltage $V_{REFP/REFN}$ is the selected reference voltage $V_{REFP}$ or $V_{REFN}$, and where the positive polarity sign of the charge on capacitors $C_A$, $C_B$ points toward the inverting input of op amp 9, at virtual ground. Solving for output voltage $V_{out}$, and assuming identical capacitance C for capacitors $C_A$ and $C_B$, the operation of switched capacitor circuit 8 amounts to:

$$V_{out} = 2\left(V_{in} - \frac{V_{REF}}{2}\right) \quad (2)$$

In this manner, the circuit of FIG. 2 generates an output voltage $V_{out}$ that corresponds to a the difference between input voltage $V_{in}$ and reference voltage $V_{REF}$ at the midpoint between reference voltages $V_{REFP}$ and $V_{REFN}$.

Another known construction of an MDAC, in this case using differential inputs, is illustrated in FIG. 3 with reference to switched-capacitor circuit 8', which includes differential op amp 9' having positive and negative polarity inputs and outputs. Switched-capacitor circuit 8' in this conventional arrangement receives inputs $V_{in}+$, $V_{in}-$ that correspond, by their difference, to the sampled input signal from sample-and-hold 2 (FIG. 1). Switched-capacitor circuit 8' again receives reference voltages $V_{REFP}$, $V_{REFN}$ that correspond to the maximum output swing of op amp 9', and that are applied to circuit 8' via MDAC switch block 37, controlled by the output of ADC 3. In this differential case, MDAC switch block 37 includes switches S31P and S35N for applying a positive differential reference voltage ($V_{REFP} - V_{REFN}$) across the sampling plates of capacitors C2, C3, includes switches S31N and S35P to apply a negative differential reference voltage ($V_{REFN} - V_{REFP}$) across the sampling plates of capacitors C2, C3, and also includes switch S33 that shorts capacitors C2 and C3 together (a zero differential reference voltage). The differential reference voltage applied to capacitors C2, C3 is determined by the result from the associated ADC stage, as before. Typical values of reference voltages $V_{REFP}$, $V_{REFN}$ in a modern conventional pipelined ADC are 2.0 volts and 1.0 volts, respectively, corresponding to the maximum and minimum voltages at the positive and negative polarity outputs of op amp 9' being 2.0 volts and 1.0 volts, respectively. This correspondence between reference voltages $V_{REFP}$, $V_{REFN}$ and the output voltages of op amp 9' is selected in order to use same-sized capacitors C1, C2, C3, C4 in the sample and feedback loops of switched-capacitor circuit 8'. Again, the differential output $V_{out}$ of op amp 9' effectively corresponds to the difference between input voltages $V_{in}+$, $V_{in}-$ and midpoint reference voltage $V_{REF}$ between reference voltages $V_{REFP}$, $V_{REFN}$ defined by:

$$\frac{V_{REF}}{2} = \frac{V_{REFP} - V_{REFN}}{2} \quad (3)$$

Switch S10, which is controlled by clock phase $\Phi_1$, connects input voltage $V_{in}+$, to capacitor C1, the other side of which is connected to the negative polarity input of op amp 9'. Switch S11, also controlled by clock phase $\Phi_1$, connects input voltage $V_{in}+$, to capacitor C2, the other side of which is connected to the negative polarity input of op amp 9'. As mentioned above, one of switches S31P, S31N, and S33 in MDAC switch block 37 is closed during non-overlapping clock phase $\Phi_2$ to connect capacitor C2 to reference voltage $V_{REFP}$ or $V_{REFN}$, or to capacitor C3, depending on the result from ADC 3. Capacitor C1 is connected as a feedback capacitor to the positive polarity output of op amp 9' by switch S13, which is clocked by clock phase $\Phi_2$. Switch S33 within MDAC switch block 37 is provided to discharge, or at least equalize, the charge at capacitors C2, C3 prior to the next sample.

Similarly, switch S20 of DAC 5' is controlled by clock phase $\Phi_1$, and connects input voltage $V_{in}-$ to capacitor C3, the other side of which is connected to the positive polarity input of op amp 9'. Switch S21 is also controlled by clock phase $\Phi_1$, and connects input voltage $V_{in}-$, to capacitor C4, the other side of which is also connected to the positive polarity input of op amp 9'. And one of switches S35P, S35N, and S33 in MDAC switch block 37 is closed during non-overlapping clock phase $\Phi_2$ to connect capacitor C3 to reference voltage $V_{REFP}$ or $V_{REFN}$, or to capacitor C2, depending on the result from ADC 3. Capacitor C4 is connected as a feedback capacitor to the negative polarity output of op amp 9' by switch S23, which is clocked by clock phase $\Phi_2$.

In addition, switch S15 connects the positive and negative inputs of op amp 9' together in response to clock phase $\Phi_1$. And in this conventional construction, capacitors C1, C2, C3, C4 all have the same capacitance as one another.

Again, in this example, switched-capacitor circuit 8' is constructed in a manner corresponding to the pipelined ADC generating one bit, or 1.5 bits, per stage 10. If each stage 10 generates multiple digital bits, then additional pairs of capacitors for each input to op amp 9' will be provided, along with switches that include (or isolate) those additional capacitors depending on the digital output from ADC 3. In any case, however, the reference voltages $V_{REFP}$, $V_{REFN}$ in this conventional pipelined ADC remain at the op amp output levels, regardless of the number of bits per stage.

In operation, clock phase $\Phi_1$ is the sample clock phase, during which time the input voltages $V_{in}+$, $V_{in}-$ are applied to capacitors C1, C2, C3, C4 via switches S10, S11, S21, S20, respectively, while switch S15 also shorts the positive and negative polarity inputs of op amp 9' together. Switches S12, S13, S22, S23 are all open during this sample phase. In this sample phase, therefore, the input voltages $V_{in}+$, $V_{in}-$ are established across capacitors C1, C2, C3, C4.

During amplify clock phase $\Phi_2$, the selected differential reference voltage are applied to capacitors C2, C3, while capacitors C1, C4 are connected into the feedback loop of op amp 9'. Charge sharing among capacitors C1, C2, C3, C4 during this clock phase thus develops a voltage at the negative polarity input to op amp 9' that corresponds to the difference between input voltage $V_{in}+$ and the selected differential reference voltage$\pm|V_{REFP}-V_{REFN}|$ or zero volts, while a voltage is developed at the positive polarity input that corresponds to the difference between input voltage $V_{in}-$ and the selected differential reference voltage. The difference between these two voltages at the input to op amp 9' thus drives a differential output voltage $V_{out}$ that, through charge sharing as discussed above relative to FIG. 2, corresponds to the differential input voltage between voltages $V_{in}+$, $V_{in}-$ and the midpoint reference voltage $V_{REF}/2$ as defined by equation (3) above.

As mentioned above, the precision with which DAC 5, 5' operates in the pipelined ADC operation is critical in the precision of the eventual result. It has been observed, in connection with this invention, that errors in the reference voltages $V_{REFP}$, $V_{REFN}$, as the case may be, directly injects error in the residue that is passed from one stage 10 to the next in the pipelined ADC. Specifically, as known in the art, each digital output bit from a given stage 10 of the pipelined ADC can be defined as:

$$int\left|\frac{V_{in}}{\left(\frac{V_{REF}}{2}\right)}\right| \times 2^n \quad (4)$$

where $V_{in}$ is the input residual voltage to the stage 10 (gained up to full scale by gain stage 7 in the preceding stage 10), and where n is the bit position generated by the given stage 10. As evident from this equation (4), error in the reference voltages $V_{REFP}$, $V_{REFN}$ translates directly into error in the digital output from the pipelined ADC.

It has also been observed, according to this invention, that there are many sources of significant error in the reference voltages applied to pipelined ADCs. The most significant cause of such error is noise that couples to the reference voltages from the rapid switching of transistors in the circuit. As described in U.S. Pat. No. 6,249,240 B1, commonly assigned with this application and incorporated herein by this reference, another source of instability in the reference voltages applied to MDACs in pipelined ADCs is the load of the MDACs themselves, which can be data-dependent as this load varies with the input voltages input voltages $V_{in}+$, $V_{in}-$. While one could wait for this induced noise to settle, prior to operation of a stage 10, this approach is of course inconsistent with the desire for extremely high sample rate operation in modern pipelined ADCs.

BRIEF SUMMARY OF THE INVENTION

It is therefore an object of this invention to provide a pipelined analog-to-digital converter (ADC) circuit having improved precision and stability.

It is a further object of this invention to provide such a circuit in which the improved stability is attained without adding complex circuitry or increasing the complexity of the manufacturing process.

It is a further object of this invention to provide such a circuit that is compatible with existing pipelined ADC architectures.

Other objects and advantages of this invention will be apparent to those of ordinary skill in the art having reference to the following specification together with its drawings.

The present invention may be implemented into switched-capacitor multiplying digital-to-analog converters (MDACs, or DACs) by providing increased reference voltages, relative to the voltage levels of the operational amplifier in the DAC. The increase in the reference voltages is compensated by reducing the size of the capacitors that are coupled to the reference voltages in the amplify, or feedback, clock phase. Additional capacitors, also of reduced size, are included to maintain a constant gain. The effect on the residue output of the switched-capacitor circuit from variations in the reference voltage level, due to noise coupling and other transient effects, is reduced.

DETAILED DESCRIPTION OF THE INVENTION

The present invention will be described in connection with its preferred embodiment, namely as implemented into a pipelined analog-to-digital converter (ADC). However, it is contemplated that this invention may also be useful in other applications, particularly those in which a multiplying digital-to-analog converter (DAC) is useful. Accordingly, it is to be understood that the following description is provided by way of example only, and is not intended to limit the true scope of this invention as claimed.

Figure 1:
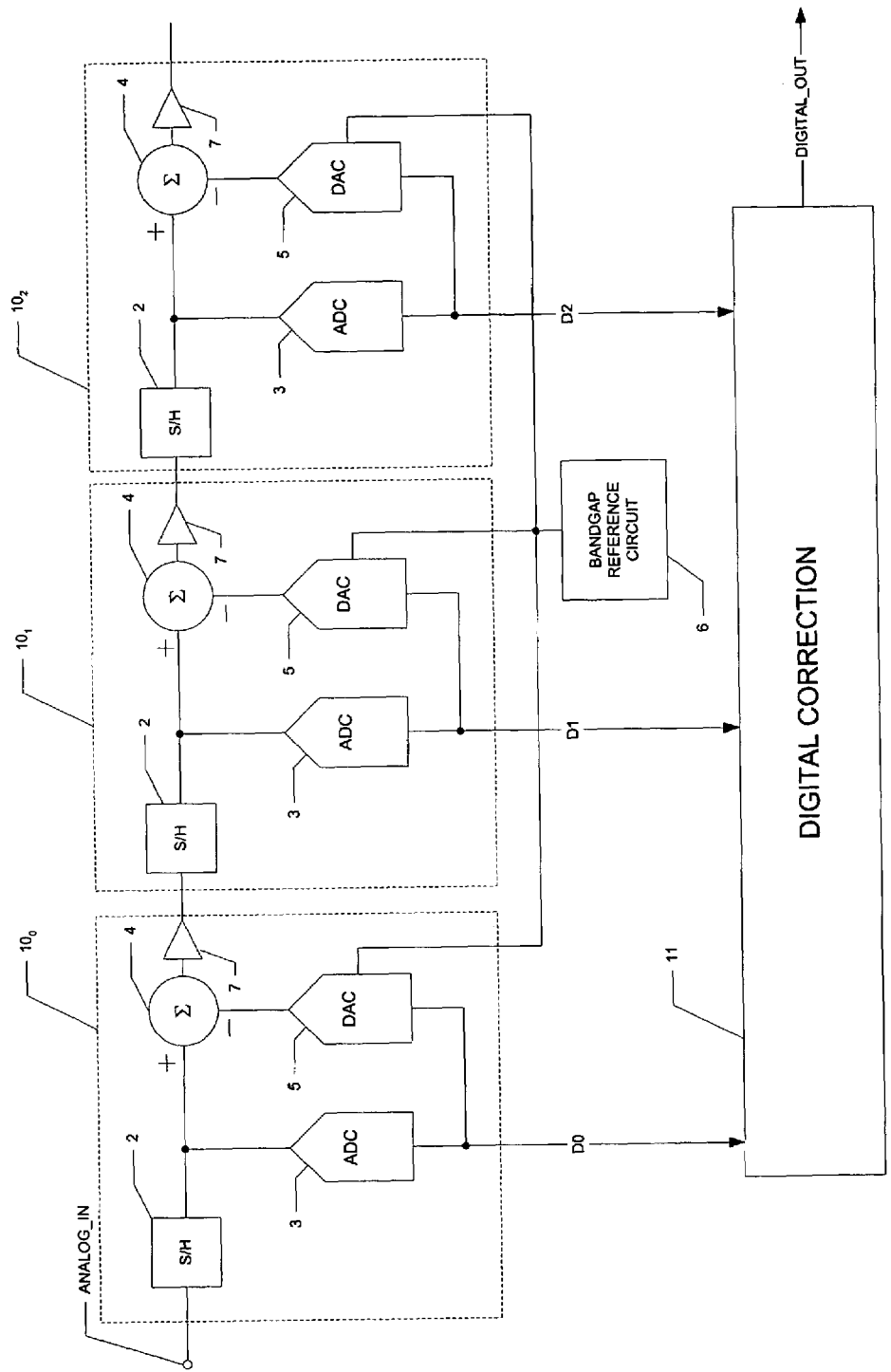
FIG. 1 is an electrical diagram, in block form, of a conventional pipelined ADC.
Figure 2:
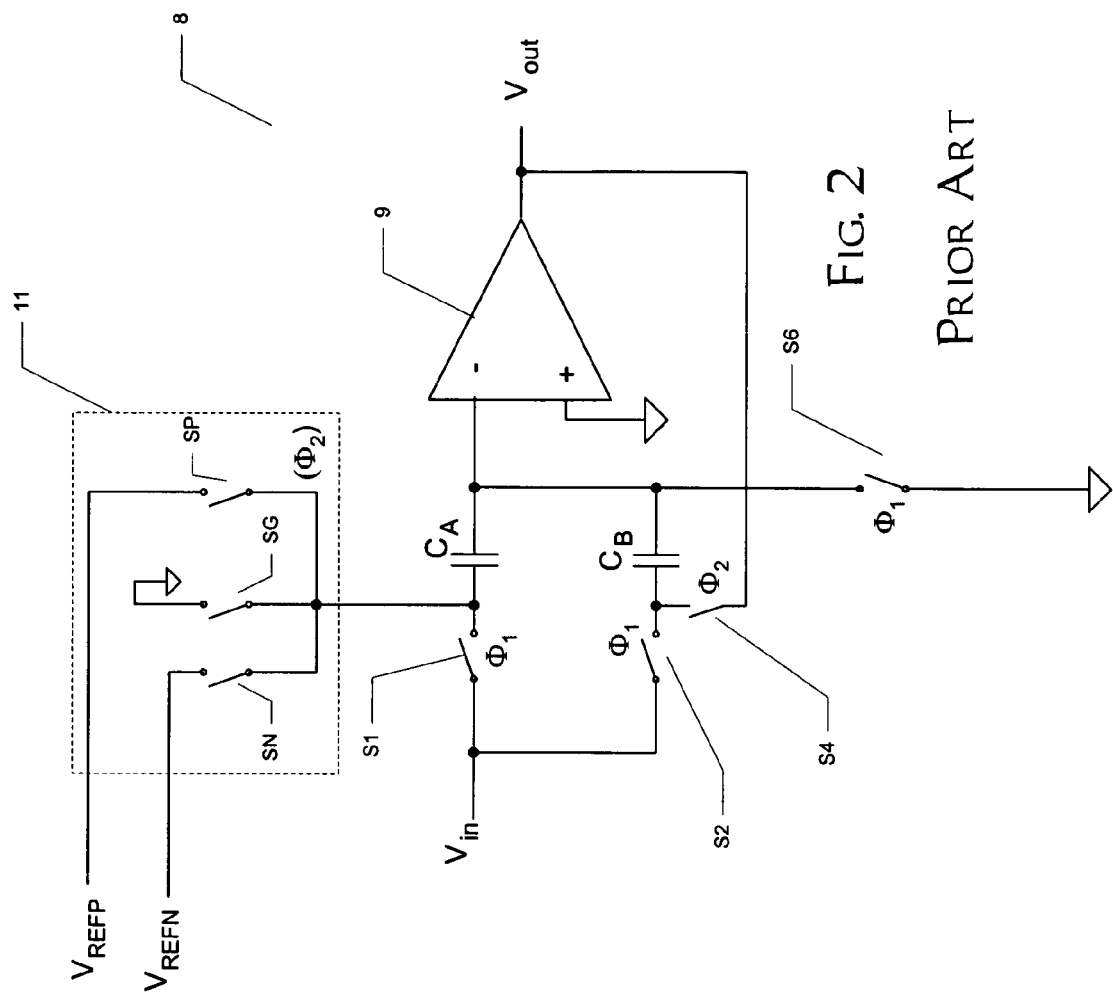
FIG. 2 is an electrical diagram, in schematic form, of a conventional single-ended multiplying DAC.
Figure 3:
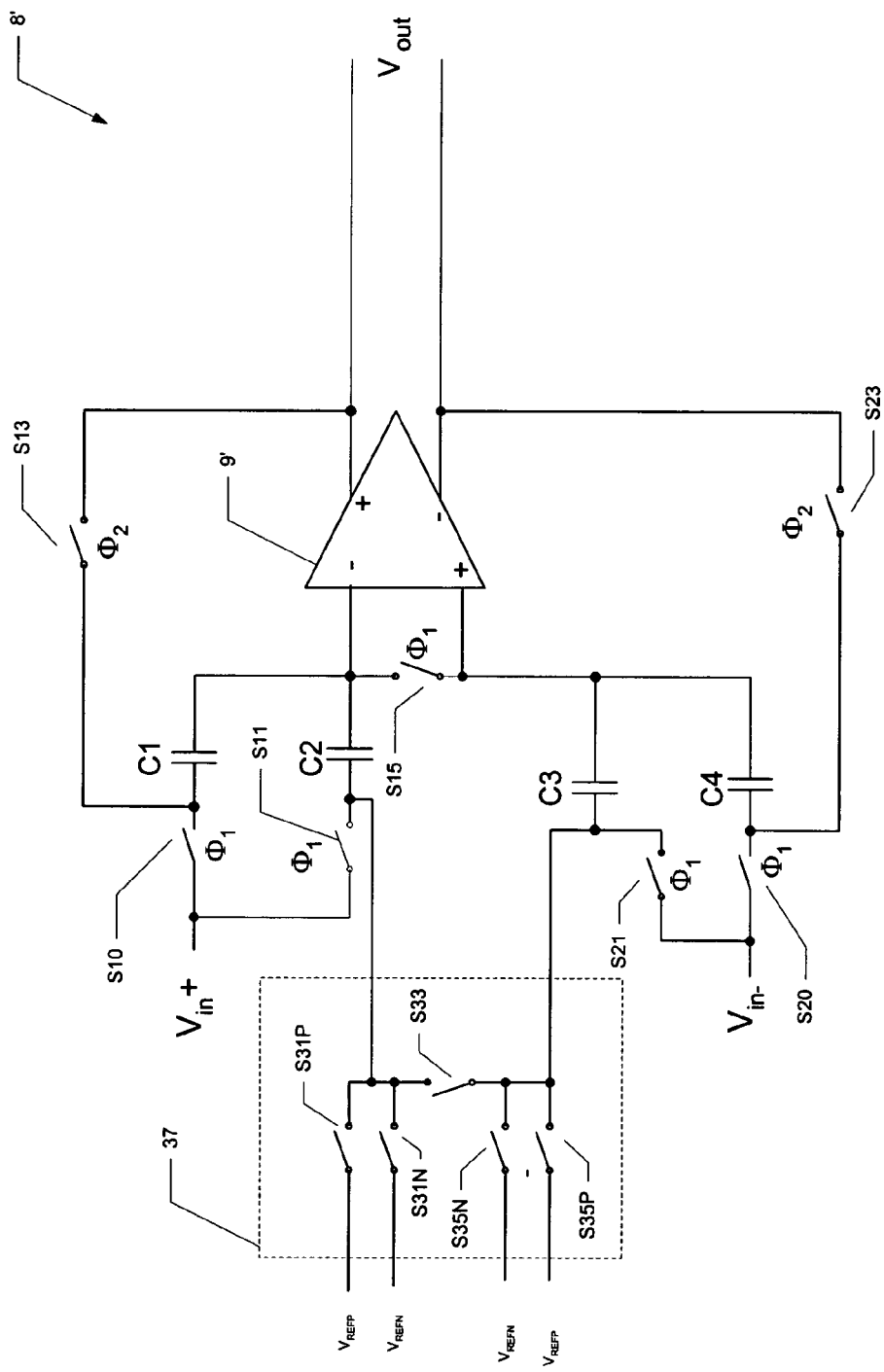
FIG. 3 is an electrical diagram, in schematic form, of a conventional differential multiplying DAC.
Figure 4:
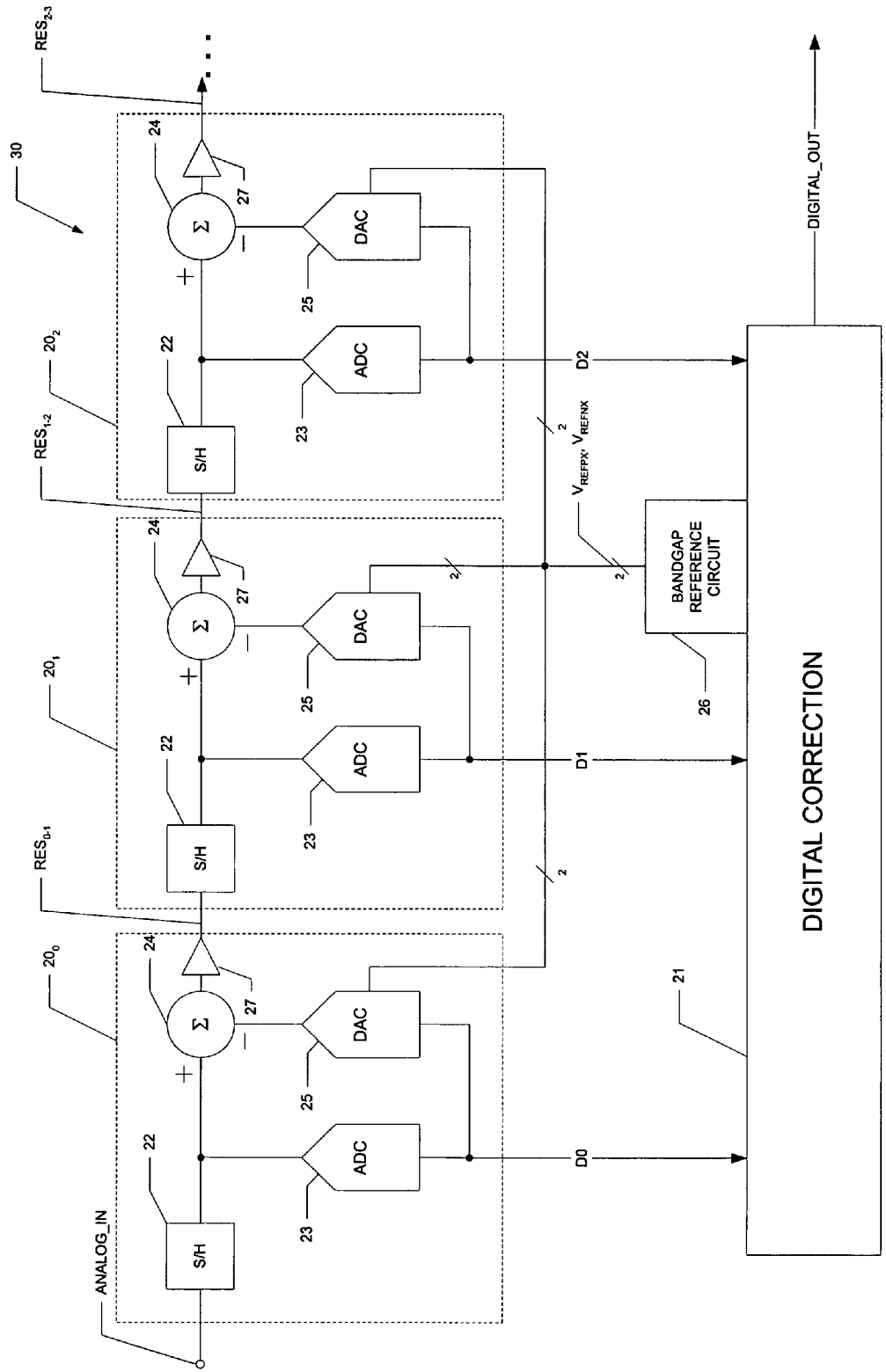
FIG. 4 is an electrical diagram, in block form, of a pipelined ADC constructed according to the preferred embodiment of the invention.

FIG. 4 illustrates pipelined ADC 30 constructed according to a preferred embodiment of this invention. As shown in FIG. 4, pipelined ADC 30 has (at least) three stages $20_0$ through $20_2$ that generate digital data on respective outputs D0 through D2. The digital outputs D0 through D2, each of which may be one or more digital bits wide, together create a digital word having a value corresponding to the analog input signal at terminal ANALOG_IN. In general, first pipeline stage $20_0$ receives the input analog signal at terminal ANALOG_IN, generates one or more digital bits on output D0, which are the most significant bits of the digital output word from pipelined ADC 30. First stage $20_0$ also generates analog residue $RES_{0-1}$ that is forwarded to next pipeline stage $10_1$ for digitization into the next most significant digital output bits at digital output D1. Pipeline stage $10_1$ also generates analog residue $RES_{1-2}$ that is forwarded to the next pipeline stage $10_2$. Stage $10_2$ generates the next most significant output digital bits on output D2, and forwards residue $RES_{2-3}$ to a next stage (not shown).

Digital outputs D0 through D2 are forwarded to digital correction function 21, which combines these outputs into an output digital word on lines DIGITAL_OUT. As known in the art, digital correction function 21 includes circuitry for effecting digital error correction, as well as the alignment in time of the digital outputs, considering that stage $10_0$ will always be operating on the most recent sample of the analog signal at terminal ANALOG_IN, while stage $20_1$ will be operating on the previous sample to that most recent sample, stage $20_2$ will be operating on the sample prior to that, and so on.

Each of pipeline stages $20_0$ through $20_2$ are similarly constructed as one another. Referring to stage $20_0$ by way of example, its input (at terminal ANALOG_IN) is connected to the input of sample-and-hold circuit 22, which is a clocked circuit that receives and stores an analog voltage corresponding to the input. The output of sample-and-hold 22 is applied to the input of analog-to-digital converter (ADC) 23, and also to an input of analog adder 24. ADC 23 digitizes the sampled analog voltage from sample-and-hold 22 into one or more digital bits that are presented at digital output D0 and that are also forwarded to multiplying digital-to-analog converter (DAC) 25. DAC 25 also receives one or more reference voltages $V_{REFPX}$, $V_{REFNX}$ from bandgap reference circuit 26; according to this embodiment of the invention, reference voltages $V_{REFPX}$, $V_{REFNX}$ are at levels that differ from their conventional levels to reduce the effects of reference voltage noise on the accuracy of pipelined ADC 30.

According to this preferred embodiment of the invention, DAC 25 generates an analog signal corresponding to a comparison of the digital output of ADC 23 relative to reference voltages $V_{REFPX}$, $V_{REFNX}$. The analog output of DAC 25 is applied to adder 24 as a subtrahend, so that the adder 24 produces an analog signal corresponding to the difference between the sampled input analog level from sample and hold circuit 22 and the analog output of DAC 25. This analog difference signal is applied to gain stage 27, which amplifies the signal by a gain corresponding to the number of digital bits at output D0 (i.e., a gain of two for one bit at output D0, a gain of four for two bits at output D0, etc.). The output of gain stage 27, which in the case of stage $20_0$ is residue $RES_{0-1}$, and is forwarded to next stage $20_1$ for the next stage of digitization.

As mentioned above, pipelined ADC 30 is pipelined in the sense that each sampled value from analog input ANALOG_IN is sequentially processed along stages $20_0$, $20_1$, $20_2$, etc. in pipelined ADC 30. In other words, sample-and-hold circuits 22 in stages $20_0$, $20_1$, $20_2$ store analog voltages derived from successive samples of the analog voltage at input ANALOG_IN (stage $20_0$ of course operating on the newest value).

As mentioned above, the accuracy of pipelined ADCs in general depends strongly on the stability and accuracy of the reference voltages used in the multiplying DAC circuits in each stage. But because of the manner in which the pipelined ADC operates, noise couples from switching devices in the circuit to these reference voltages, especially at high switching or sample rates. However, it has been observed, in connection with this invention, that the amplitude of the noise that couples to the reference voltages does not depend on the level of the reference voltage itself. And it also has been observed, also in connection with this invention, that the percentage error in the output of the multiplying DAC corresponds to the percentage error in the reference voltage. Therefore, because of the recognition that the noise level is independent of the reference voltage level, it has been discovered, in connection with this invention, that the multiplying DAC output error can be reduced by increasing the level of the reference voltage. By increasing the reference voltage level, the same amplitude level of noise results in a smaller percentage error in the reference voltage, and thus a smaller percentage error in the multiplying DAC output.

Figure 5:
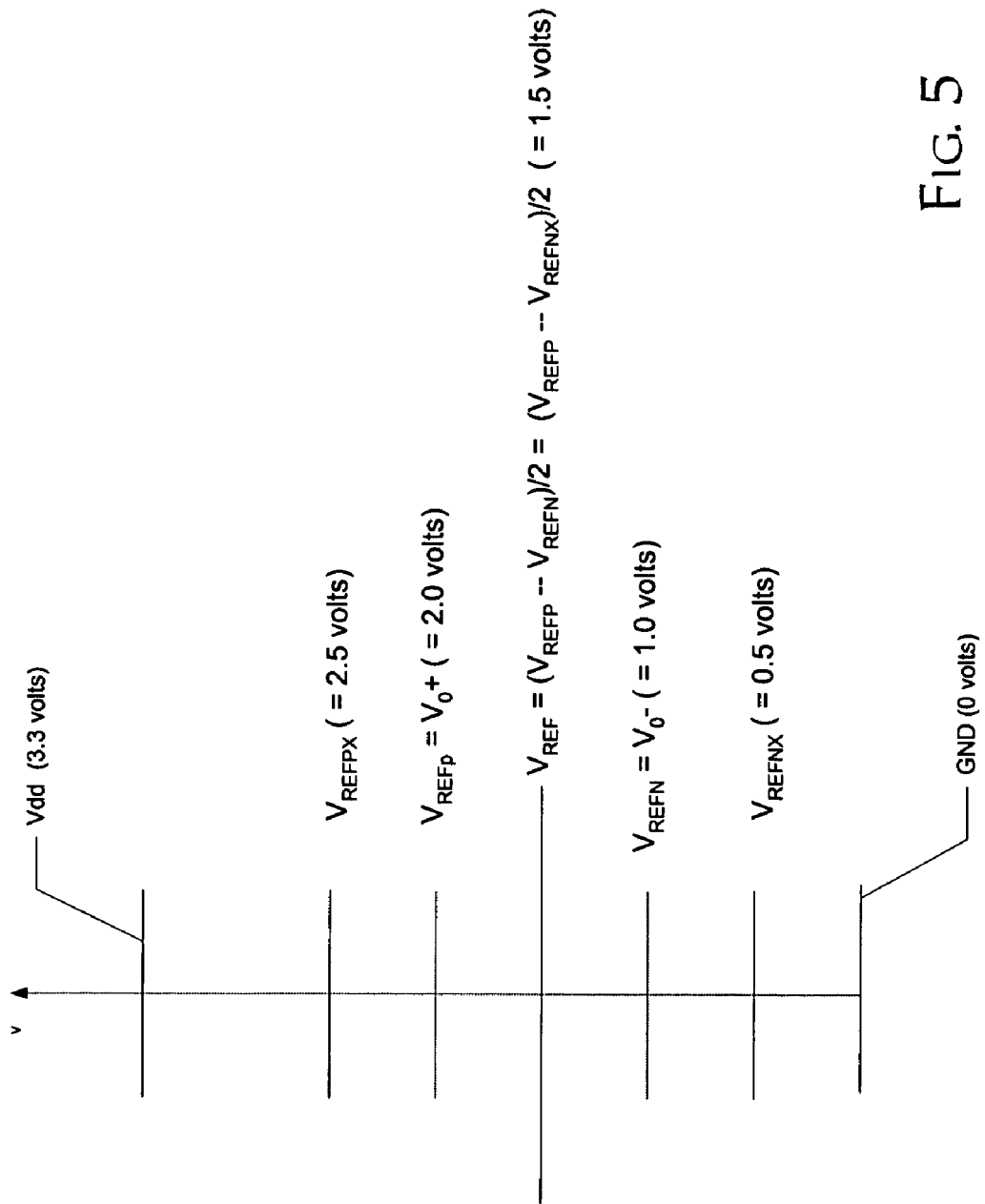
FIG. 5 is a voltage level plot, illustrating the reference voltages applied to a multiplying DAC according to the preferred embodiment of the invention.

FIG. 5 illustrates this concept of the invention, with reference to an example of the reference voltages $V_{REFPX}$, $V_{REFNX}$ according to this preferred embodiment of the invention, in comparison with conventional reference voltages $V_{REFP}$, $V_{REFN}$. As mentioned above, in conventional pipelined ADC and MDACs, conventional reference voltages $V_{REFP}$, $V_{REFN}$ correspond to the output levels $V_O+$, $V_O-$ of the operational amplifier in the MDAC. Exemplary levels for these conventional reference voltages $V_{REFP}$, $V_{REFN}$, in the case in which the positive power supply voltage Vdd is 3.3 volts, are 2.0 volts and 1.0 volts, respectively. Also as mentioned above, in operation, the midpoint reference voltage $V_{REF}$ is the midpoint between the differential conventional reference voltages $V_{REFP}$, $V_{REFN}$, and is 1.5 volts in this example. According to the preferred embodiment of the invention, reference voltages $V_{REFPX}$, $V_{REFNX}$ are set to higher voltage levels, relative to the midpoint reference voltage $V_{REF}$, even though the operational amplifier output levels $V_O+$, $V_O-$ will remain the same (e.g., at 2.0 volts and 1.0 volts, respectively, in this example). In the example of FIG. 5, reference voltages $V_{REFPX}$, $V_{REFNX}$ are doubled (relative to midpoint reference voltage $V_{REF}$), and are thus at 2.5 volts and 0.5 volts, respectively. The midpoint reference voltage $V_{REF}$ remains the same, at 1.5 volts, and as such the MDAC analog output signal will not vary from conventional MDAC operation. However, to the extent that noise couples to reference voltages $V_{REFPX}$, $V_{REFNX}$, the effect of that noise will be reduced by one-half, according to this exemplary implementation of the preferred embodiment of the invention.

An example of the application of these enhanced reference voltages $V_{REFPX}$, $V_{REFNX}$, and the resulting improved precision in digital-to-analog precision, will now be described relative switched-capacitor circuit 28, constructed according to a first preferred embodiment of the invention and illustrated in FIG. 6. Switched-capacitor circuit 28 is a one-bit multiplying DAC in a full differential signal implementation, and corresponds to DAC 25, adder 24, and gain stage 27 in a stage 20 of pipelined ADC 30 according to a preferred embodiment of the invention. As will be evident to those skilled in the art having reference to this specification, and from the following description, this invention may also be implemented in connection with a multiple-bit multiplying DAC, and also in a single-ended input fashion, if desired.

Switched-capacitor circuit 28 includes differential operational amplifier ("op amp") 39, which thus has positive and negative polarity inputs and outputs. A differential input voltage is received from sample-and-hold 22, on lines $V_{in}+$, $V_{in}-$. Line $V_{in}+$ is coupled to one plate of each of capacitors C10, $C12_1$, $C12_2$ through switches S40, S41, S42, respectively. The opposite plates of capacitors C10, $C12_1$, $C12_2$ are connected to the negative polarity input of op amp 39, and each of switches S40, S41, S42 are clocked by clock phase $\Phi_1$. Similarly, line $V_{in}-$ is coupled to one plate of each of capacitors C20, $C22_1$, $C22_2$ through switches S50, S51, S52, respectively. The other plates of capacitors C20, $C22_1$, $C22_2$ are connected to the positive polarity input of op amp 39, and switches S50, S51, S52 are also clocked by clock phase $\Phi_1$. The inputs of op amp 39 are connected to one another by switch S45, which is also clocked by clock phase $\Phi_1$. And the input plates of capacitors $C12_1$ and $C22_1$ are coupled together via switch S47, which is clocked by clock phase $\Phi_2$, which is a non-overlapping clock phase relative to clock phase $\Phi_1$, and may indeed be the logical complement of clock phase $\Phi_1$ if desired.

Switches S40, S41, S42, S45, S47, S50, S51, S52, as well as the other switches in switched-capacitor circuit 28, are preferably implemented by way of conventional pass gates using the manufacturing technology (MOS, bipolar, CMOS, etc.).

Capacitors C10, C20 are each also coupled to the positive and negative polarity outputs of op amp 39 through switches S43, S53, respectively. Switches S43, S53 are clocked by clock phase $\Phi_2$. In this manner, capacitors C10, C20 are input sampling capacitors during clock phase $\Phi_1$, and are feedback capacitors to op amp 39 during clock phase $\Phi_2$, as conventional for multiplying DAC circuits.

Capacitors $C12_1$, $C22_1$ are each also coupled to a selected one of reference voltages $V_{REFPX}$, $V_{REFNX}$ generated by bandgap reference circuit 26 in the example of FIG. 4, via MDAC switch block 47. MDAC switch block 47 is constructed as described above relative to MDAC switch block 37, and as such applies a differential reference voltage to capacitors $C12_1$ and $C22_1$ according to the result from ADC 23, in the example of FIG. 4. This ADC result is based on the digitization of the input differential voltage presented by sample-and-hold circuit 22 on lines $V_{in}+$, $V_{in}-$. In this example, the possible values of this differential reference voltage include the positive polarity differential reference voltage $V_{REFPX}-V_{REFNX}$, the negative polarity differential reference voltage $V_{REFNX}-V_{REFPX}$, and a zero diffential voltage reference (capacitors $C12_1$ and $C22_1$ shorted together). The switches within MDAC switch block 47 that are to establish this differential reference voltage are clocked by clock phase $\Phi_2$.

According to this preferred embodiment of the invention, however, as described above relative to FIG. 5, bandgap reference circuit 26 outputs reference voltages $V_{REFPX}$, $V_{REFNX}$ at enhanced levels, relative to conventional multiplying DACs and relative to the output rail voltages from op amp 39. In this example of FIGS. 5 and 6, the levels of reference voltages $V_{REFPX}$, $V_{REFNX}$ are doubled, relative to the midpoint voltage $V_{REF}$ from that of the output levels $V_0+$, $V_0-$ of op amp 39. This enhancement of reference voltages $V_{REFPX}$, $V_{REFNX}$ is compensated for, in switched-capacitor circuit 38, by the relative sizes of capacitors $C12_1$, $C22_1$ relative to capacitors C10, C20. As known in the art, and as described above, the multiplying DAC operation relies on charge-sharing among the capacitors between the sample and amplify clock phases $\Phi_1$, $\Phi_2$ respectively. For proper implementation of the gain of circuit 38, the charge applied to capacitors $C12_1$, $C22_1$ from reference voltages $V_{REFPX}$, $V_{REFNX}$ in the amplify clock phase $\Phi_2$ is maintained equivalent, according to this embodiment of the invention, by adjusting the size of capacitors $C12_1$, $C22_1$ to account for the increased reference voltages $V_{REFPX}$, $V_{REFNX}$ relative to the output levels $V_0+$, $V_0-$ of op amp 39. For the doubling of reference voltages $V_{REFPX}$, $V_{REFNX}$ relative to midpoint reference voltage $V_{REF}$, in this example, capacitors $C12_1$, $C22_1$ are each one-half the size of capacitors C10, C20.

Capacitors $C12_2$ and $C22_2$ are provided to compensate for the change in the circuit gain that would otherwise occur by reducing the size of capacitors $C12_1$ and $C22_1$ relative to capacitors C10, C20. As known in the art, the gain of a circuit such as switched-capacitor circuit is proportional to the ratio of the feedback capacitance to the sampling capacitance. According to this embodiment of the invention, in which the desired circuit gain is two, capacitors $C12_1$ and $C12_2$ are sized so that their impedance, in parallel, matches the impedance of feedback capacitor C10; capacitors $C22_1$, $C22_2$ are similarly sized, of course. In the example in which the levels of reference voltages $V_{REFPX}$, $V_{REFNX}$ are doubled and thus capacitors $C12_1$, $C22_1$ have one-half the capacitance of capacitors C10, C20, capacitors $C12_2$ and $C22_2$ also have one-half the capacitance of capacitors C10, C20.

The capacitance of capacitor $C12_1$ relative to that of capacitor $C12_2$ (and, of course, the capacitance of $C22_1$ relative to $C22_2$) need not be equal, so long as the sum of the two capacitances equals that of capacitor C10 (or C20). For example, capacitor $C12_1$ may have twice the capacitance of capacitor $C12_2$; in this case, capacitor $C12_1$ would have two-thirds the capacitance of capacitor C10, and capacitor $C12_2$ would have one-third the capacitance of capacitor C10. In this case, the levels of reference voltages $V_{REFPX}$, $V_{REFNX}$ would be tripled, relative to the midpoint voltage $V_{REF}$, from that of the output levels $V_0+$, $V_0-$ of op amp 39.

Further in the alternative, the sum of the capacitances of capacitors $C12_1$ and $C12_2$ need not be equal to the capacitance of capacitor 10. However, the gain of the circuit would vary from two according to the capacitance ratio, in such a case.

In the operation of switched-capacitor circuit 38, the input voltages $V_{in}+$, $V_{in}-$ are applied to capacitors C10, $C12_1$, $C12_2$, C20, $C22_1$, and $C22_2$, via switches S40, S41, S42, S50, S51, and S52, respectively, in response to an active level of clock phase $\Phi_1$ in the sample clock phase. Also during the sample clock phase, switch S45 also shorts the positive and negative polarity inputs of op amp 39 together, permitting the input differential voltage to be sampled and stored across capacitors C10, C12$_1$, C12$_2$, C20, C22$_1$, and C22$_2$. Switches S42, S43, S52, S53 are all open during this sample phase.

In the "amplify" clock phase $\Phi_2$ following sample clock phase $\Phi_1$, switches S40, S41, S42, S50, S51, S52, and S45 all open, and switches S42, S43, S52, S53 all close. In this amplify clock phase, capacitors C10, C20 each become feedback capacitors, while the differential reference voltage that is selected by MDAC switch block 47 in response to the output of ADC 23 (FIG. 4) is applied to capacitors C12$_2$, C22$_2$ by switches S42, S43, respectively. Switch 47 is also closed during this phase, shorting plates of capacitors C12$_1$, C22$_1$ to one another; alternatively, if implemented in single-ended (non-differential) form, capacitor C12$_1$ would be grounded instead. In this amplify clock phase $\Phi_2$, therefore, the charge sharing among capacitors C10, C12$_1$, C12$_2$, C20, C22$_1$, and C22$_2$ develops a voltage at the negative polarity input of op amp 39 that corresponds to the difference between the differential input voltage V$_{in}$+ and the selected differential reference voltage, and develops a voltage at the positive polarity input of op amp 39 that corresponds to the difference between input voltage V$_{in}$− and the selected differential reference voltage. This differential voltage across the inputs of op amp 39 causes op amp 39 to generate a differential output voltage V$_{out}$. This output voltage V$_{out}$ corresponds to the residue analog signal between the differential input voltage on lines V$_{in}$+, V$_{in}$− from sample-and-hold 22, relative to the midpoint reference voltage V$_{REF}$, considering the digitization results of ADC 23 (in the selection of the differential reference voltage).

Accordingly, the operation of switched-capacitor circuit 38 according to this preferred embodiment of the invention is substantially identical to that of conventional multiplying DACs, from the standpoint of the input differential voltage on lines V$_{in}$+, V$_{in}$− and the output voltage V$_{out}$. However, according to the preferred embodiment of the invention, any noise present on the reference voltages, specifically enhanced reference voltages V$_{REFPX}$, V$_{REFNX}$, will have a reduced effect on the output voltage V$_{out}$. This reduced effect is linear with the increase in the reference voltage level from the conventional levels (i.e., measured by the full output range of the op amp), relative to the midpoint reference level, because the noise that couples to the reference voltages is believed to be independent of the level of the reference voltage itself.

As evident from this description, this reduction in the noise effects at the output of the multiplying DAC implemented by the switched-capacitor circuit according to the preferred embodiment of the invention is achieved at very little cost in circuit or manufacturing process complexity. Of course, the enhanced reference voltages must be generated by a bandgap reference circuit or other regulated voltage source, but it is contemplated that the generation of these voltages will not be difficult using conventional techniques. And the compensation within each instance of the switched-capacitor circuits of the pipelined ADC is also not expected to add any cost in chip area, or manufacturing or circuit complexity; rather, only a scaling adjustment in size of the reference capacitors is required. Considering that reference error and noise is often a limiting factor in the precision and accuracy of pipelined ADCs, the improved precision provided by this preferred embodiment of the invention is not only extremely important in modern high-precision, high sample rate, ADCs, but is attained at minimal cost.

Figure 7:
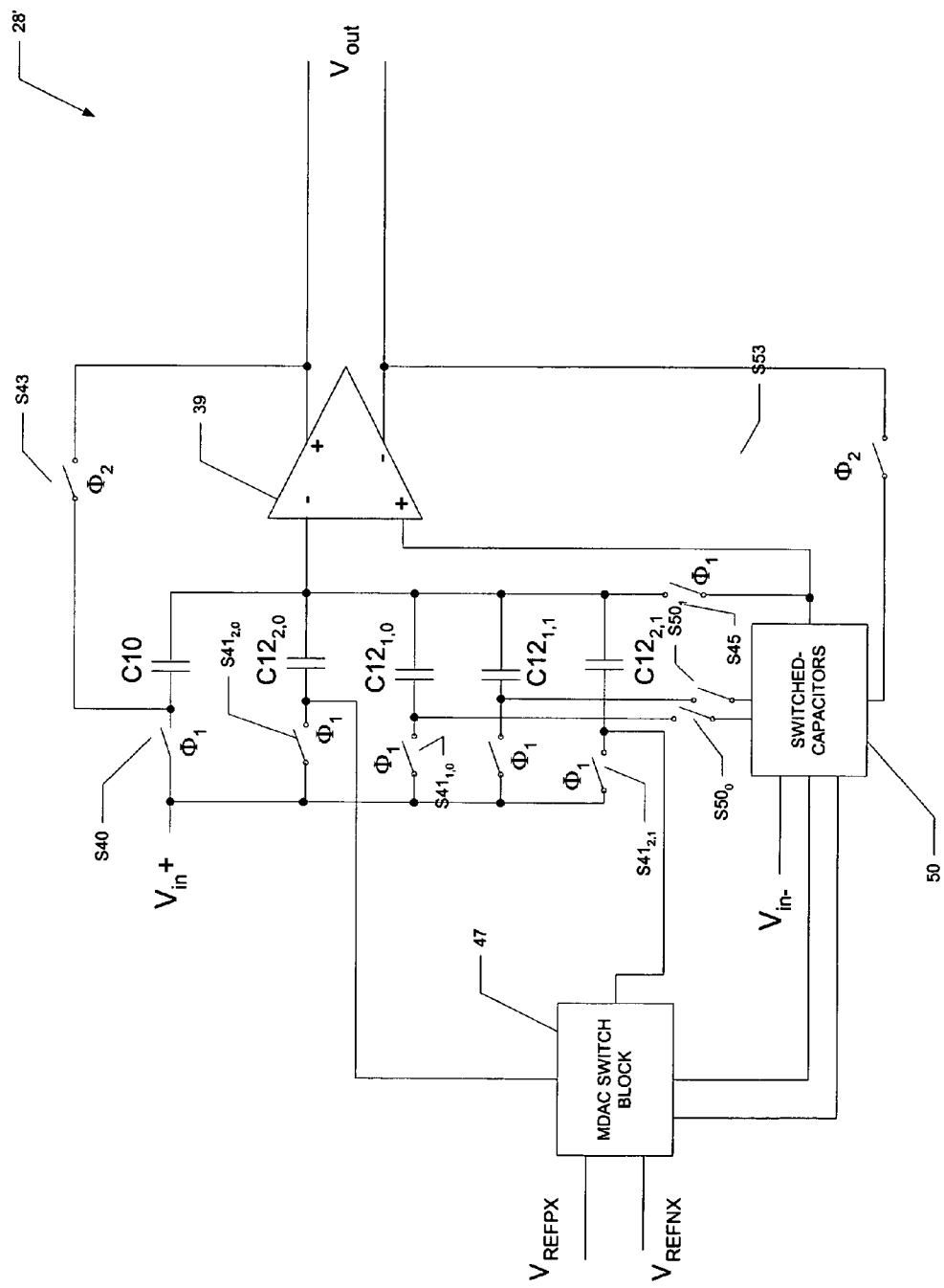
FIG. 7 is an electrical diagram, in schematic form, of an example of the multiplying DAC in the pipelined ADC of FIG. 4, and constructed according to a second preferred embodiment of the invention.

FIG. 7 illustrates switched-capacitor circuit 28' in an implementation in which it generates a residue signal based on a multiple-bit digitization by ADC 23 (FIG. 4). In this example, two bits from ADC 23 determine the number of capacitors to include in the circuit during the amplify clock phase of the circuit, and in this manner determine the particular voltage level relative to which the residue signal is to be derived and also the gain to be applied to the analog residue. This particular operation of multiplying DAC circuits is well-known in the art.

As shown in FIG. 7, circuit 28' again includes capacitor C10, which is connected to receive input voltage line V$_{in}$+ through switch S40 in sample clock phase $\Phi_1$, and that is connected as a feedback capacitor through switch S43 in amplify clock phase $\Phi_2$. As before, the opposite plate of capacitor C10 is coupled to the negative polarity input of differential op amp 39. Circuit 28' includes a first pair of capacitors C12$_{2,0}$, C12$_{2,1}$, one plate of each of which are connected to receive the input voltage on line V$_{in}$+ through switches S41$_{2,0}$, S41$_{2,1}$, respectively; the other plates of capacitors C12$_{2,0}$, C12$_{2,1}$ are connected to the negative polarity input of op amp 39. In this differential implementation, a corresponding pair of capacitors is connected to the positive polarity input of op amp 39, contained within switched-capacitor block 50. This first pair of capacitors C12$_{2,0}$, C12$_{2,1}$ are associated with one bit of the multi-bit result from ADC 23, and additional pairs of capacitors are associated with each of the other result bits, such that the number of capacitor pairs (per input to op amp 39) corresponds to the number of digital bits to be used in the operation of this multiplying DAC function. In this example, two bits are output by ADC 23, and as such a second pair of capacitors C12$_{1,0}$, C12$_{1,1}$ are connected to the negative polarity input of op amp 39 in circuit 28'. Capacitors C12$_{1,0}$, C12$_{1,1}$ are connected to respective switches S42$_{1,0}$, S42$_{1,1}$ to also receive the input voltage on line V$_{in}$+ in sample clock phase $\Phi_1$.

As mentioned above, capacitors C12$_{1,0}$, C12$_{1,1}$, C12$_{2,0}$, C12$_{2,1}$, are all connected to the negative polarity input of op amp 39. Switched-capacitor block 50 in this example corresponds to a similarly constructed and arranged capacitors, matching capacitors C12$_{1,0}$, C12$_{1,1}$, C12$_{2,0}$, C12$_{2,1}$, and that are connected to the positive polarity input of op amp 39. Switch S45 is connected between the two inputs to op amp 39, and is closed during the sample clock phase $\Phi_1$, as before.

MDAC switch block 47' is constructed similarly as MDAC switch block 47 described above relative to FIG. 6, but also includes additional switches for independently switching and controlling the reference voltages applied to the additional capacitors in this embodiment of the invention. In this example MDAC switch block 47' is connected to one capacitor in each pair, namely capacitors C12$_{2,0}$, C12$_{2,1}$ associated with the negative polarity input to op amp 39, and to corresponding capacitors in switched-capacitor block 50. MDAC switch block 47' is controlled by ADC 23 to apply the appropriate enhanced reference voltages V$_{REFPX}$, V$_{REFNX}$, or to close a shorting switch, so that the appropriate enhanced differential reference voltage (including zero differential voltage) is applied to these capacitors in response to the digitized value of the input differential voltage. And because of the multi-bit digitization in this example, the different capacitors C12$_{2,0}$, C12$_{2,1}$ and their matching capacitors in switched-capacitor block 50 independently receive their differential reference voltage (i.e., the reference voltage applied to capacitor C12$_{2,0}$ may differ from that applied to capacitor C12$_{2,1}$), depending of course on the ADC result.

As before, the enhanced reference voltages V$_{REFPX}$, V$_{REFNX}$ are contemplated by the selection of the sizes of capacitors C12. For the example of doubled reference voltages $V_{REFPX}$, $V_{REFNX}$ relative to the full scale output voltages $V_0+$, $V_0-$ of op amp 39, capacitors $C12_{2,0}$, $C12_{2,1}$ will each be one-half the size of capacitor C10. In addition, if a binary variation in the capacitance of capacitors C12 is desired for purposes of deriving the appropriate reference charge for the various values of the digitized input voltage and the gain to be applied to the analog residue, such a binary variation will also be present among these capacitors C12. In any case, however, the sizes of the capacitors C12 will be scaled according to the relationship between the full scale output levels of op amp 39 and the enhanced reference voltages $V_{REFPX}$, $V_{REFNX}$.

And as in the previously-described embodiment of the invention, the gain of circuit 28' is maintained constant by the provision of capacitors $C12_{1,0}$, $C12_{1,1}$, and their corresponding capacitors in switched-capacitor block 50. In this example, capacitors $C12_{1,0}$, $C12_{1,1}$ do not receive a reference voltage in the amplify clock phase from MDAC switch block 47', but instead are shorted to their corresponding capacitors in switched-capacitor block 50 by way of switches $S50_0$, $S50_1$, respectively. The sizes of these capacitors $C12_{1,0}$, $C12_{1,1}$ correspond to the size of their corresponding capacitors $C12_{2,0}$, $C12_{2,1}$, and to the relationship of the sum of these capacitor pairs to capacitor C10. In this example, in which reference voltages $V_{REFPX}$, $V_{REFNX}$ are doubled relative to the full scale output voltages $V_0+$, $V_0-$ of op amp 39 and in which capacitors $C12_{2,0}$, $C12_{2,1}$ are each one-half the size of capacitor C10, additional capacitors $C12_{1,0}$, $C12_{1,1}$, are also each one-half the size of capacitor C10. As described above, however, capacitors C12 can be varied in size, depending on this voltage and the ultimate gain of circuit 28'.

Figure 6:
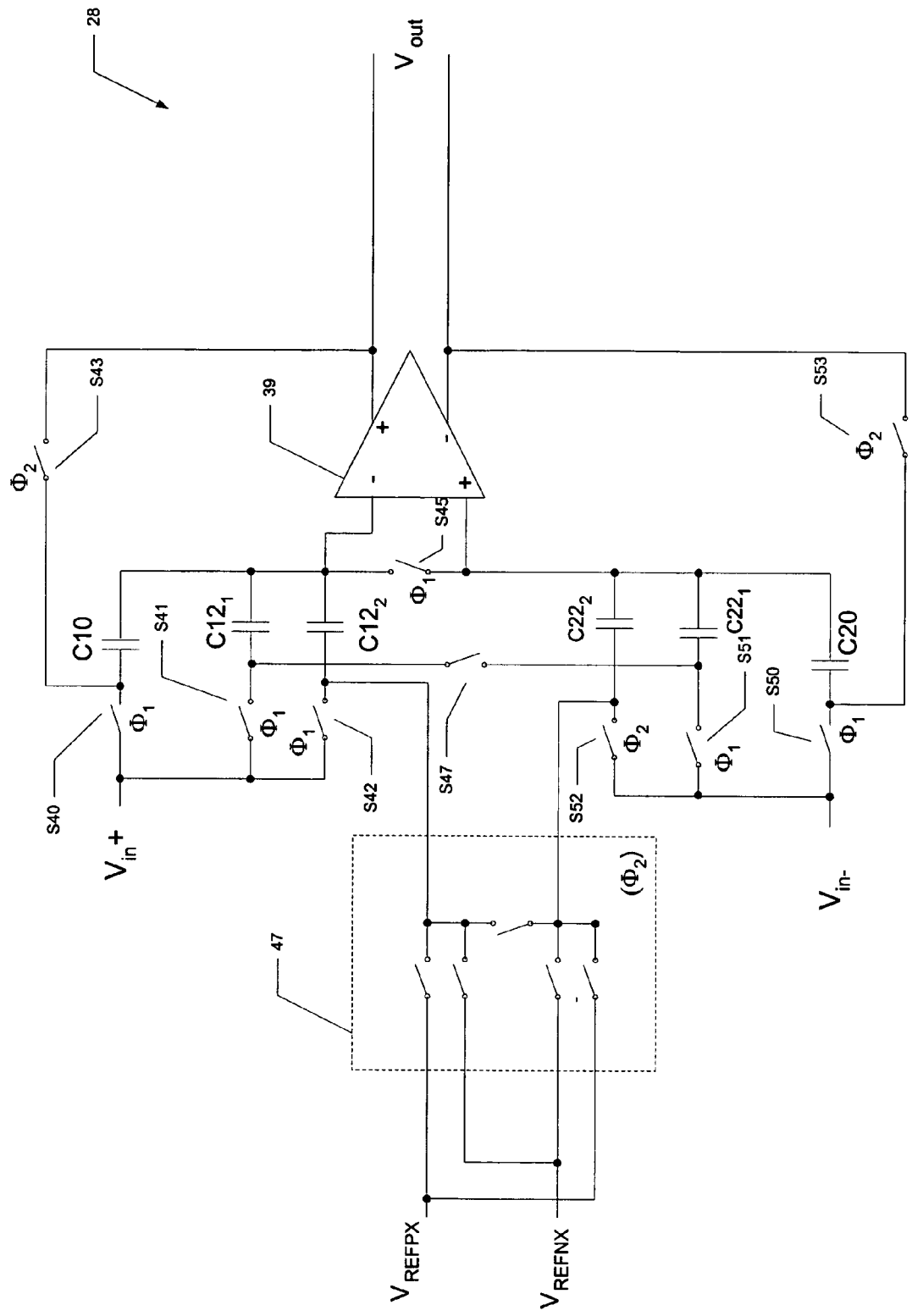
FIG. 6 is an electrical diagram, in block form, of a differential multiplying DAC in the pipelined ADC of FIG. 4, and constructed according to a first preferred embodiment of the invention.

In switched-capacitor circuit 28' as shown in FIG. 7, as in the case of circuit 28 of FIG. 6, any error due to switching noise or load-dependent factors that appears at reference voltages $V_{REFPX}$, $V_{REFNX}$ will have a reduced effect on output voltage $V_{out}$ because of the increased levels of reference voltages $V_{REFPX}$, $V_{REFNX}$ relative to the output levels $V_0+$, $V_0-$ of op amp 39. The additional capacitors provided in the circuit maintain a constant gain for the circuit, without impacting its accuracy. Again, this improvement in multiplying DAC precision, and thus precision in the performance of pipelined ADC functions incorporating such circuitry, that is attained by this embodiment of the invention comes at little, if any, cost in chip area, circuit complexity, or manufacturing process complexity.

As evident from each of the embodiments of the invention described above, this invention provides the important advantages of improved precision in the analog residue levels that are forwarded from stage to stage in a pipelined ADC, without adding complexity or cost as the function is implemented. For example, as much as 6 dB improvement in the signal-to-noise ratio has been observed. This improved precision is of course important in its own right, but also enables other benefits in electronic systems. For example, the performance margin provided by this invention can be used to further increase the transistor switching rates, and thus the sampling rate, of pipelined ADCs. In addition, this margin can enable other improvements, such as reduction in the gate-to-drain voltages in the switching devices that can, in turn, enable smaller transistors and thus reduction in chip area.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A multiplying digital-to-analog converter (DAC), comprising:
   an operational amplifier, having first and second inputs, and having an output driving a signal over an output range between first and second output level voltages responsive to signals received at the first and second inputs;
   a first sampling capacitor circuit, comprising a first sample capacitor, for receiving an input voltage and storing the input voltage at the first sample capacitor in a first clock phase, the first sampling capacitor circuit having an output coupled to a first input of the operational amplifier;
   a first feedback switch, connected between the output of the operational amplifier and the first sample capacitor, for connecting the first sample capacitor in a feedback loop in a second clock phase; and
   a first reference capacitor circuit, comprising:
      a first reference capacitor, coupled to the first input of the operational amplifier;
      a first parallel capacitor, coupled to the first input of the operational amplifier;
      clocked switches, for coupling the input voltage to the first reference capacitor and the first parallel capacitor in the first clock phase; and
   switch circuitry, for receiving a reference voltage that exceeds the first output level voltage by a factor, and for charging the first reference capacitor with the reference voltage in the second clock phase, the first reference capacitor having a capacitance less than a capacitance of the first sample capacitor by the factor.

2. The multiplying DAC of claim 1, wherein the operational amplifier is a differential operational amplifier and the output of the operational amplifier comprises first and second outputs;
   wherein the first feedback switch is connected between the first output of the operational amplifier and the first sample capacitor;
   wherein the input voltage is a differential voltage across first and second input lines, the first sampling capacitor circuit receiving the input voltage at the first input line;
   and further comprising:
      a second sampling capacitor circuit, comprising a second sample capacitor, for receiving an input voltage at the second input line and storing the input voltage at the second sample capacitor in the first clock phase, the second sampling capacitor circuit having an output coupled to the second input of the operational amplifier;
      a second feedback switch, connected between the second output of the operational amplifier and the second sample capacitor, for connecting the second sample capacitor in a feedback loop in the second clock phase; and
      a second reference capacitor circuit, comprising:
         a second reference capacitor, coupled to the second input of the operational amplifier;
         a second parallel capacitor, coupled to the second input of the operational amplifier; and clocked switches, for coupling the input voltage at the second input line to the second reference capacitor and the second parallel capacitor in the first clock phase;

and wherein the switch circuitry is also for receiving a reference voltage that exceeds the second output level voltage by a factor, and for charging the second reference capacitor with the reference voltage in the second clock phase, the second reference capacitor having a capacitance less than a capacitance of the second sample capacitor by the factor.

3. The multiplying DAC of claim 2, wherein the first and second reference voltages exceed the first and second output level voltages, respectively, relative to a midpoint voltage between the first and second reference voltages.

4. The multiplying DAC of claim 1, further comprising:
a shorting switch for shorting the parallel capacitor in the second clock phase.

5. The multiplying DAC of claim 2, further comprising:
a shorting switch, for connecting the first and second parallel capacitors to one another in the second clock phase.

6. The multiplying DAC of claim 1, wherein the factor is two.

7. The multiplying DAC of claim 6, wherein the first reference capacitor and first parallel capacitor have the same capacitance as one another.

8. A multiplying digital-to-analog converter (DAC), comprising:
an operational amplifier, having an input, and having an output for presenting an output analog signal over a range between a first voltage and a second voltage responsive to a signal at its input;
a first sample capacitor, having a first plate, and having a second plate connected to the input of the operational amplifier;
a first reference capacitor, having a first plate, and having a second plate connected to the input of the operational amplifier;
a first parallel capacitor, having a first plate, and having a second plate connected to the input of the operational amplifier;
a first sample switch, connected between an input and the first plate of the first sample capacitor, and clocked by a first clock phase;
a second sample switch, connected between the input and the first plate of the first reference capacitor, and clocked by the first clock phase;
a third sample switch, connected between the input and the first plate of the first parallel capacitor, and clocked by the first clock phase;
a first feedback switch, connected between the output of the operational amplifier and the first plate of the first sample capacitor, and clocked by a second clock phase;
reference voltage switch circuitry, connected between a reference voltage and the first plate of the first reference capacitor, and clocked by the second clock phase; and
a first shorting switch, connected to the first plate of the first parallel capacitor, and clocked by the second clock phase;
wherein the reference voltage exceeds the first voltage by a factor; and
wherein the first reference capacitor has a capacitance that is less than a capacitance of the first sample capacitor by the factor.

9. The multiplying DAC of claim 8, wherein the first shorting switch is for connecting the first plate of the first parallel capacitor to a ground voltage in the second clock phase.

10. The multiplying DAC of claim 8, wherein the reference voltage switch circuitry is for connecting the first plate of the first reference capacitor to a first reference voltage or to a second reference voltage, as the reference voltage, responsive to a digital value;
wherein the first reference voltage exceeds the first voltage by the factor;
and wherein the second reference voltage exceeds the second voltage by the factor.

11. The multiplying DAC of claim 8, wherein the operational amplifier is a differential operational amplifier, the input of the operational amplifier comprising first and second inputs, and the output of the operational amplifier comprises first and second outputs;
wherein the first feedback switch is connected between the first output of the operational amplifier and the first sample capacitor;
wherein the input voltage is a differential voltage across first and second input lines, the first and second sample switches receiving the input voltage at the first input line;
and further comprising:
a second sample capacitor, having a first plate, and having a second plate connected to the second input of the operational amplifier;
a second reference capacitor, having a first plate, and having a second plate connected to the second input of the operational amplifier;
a second parallel capacitor, having a first plate, and having a second plate connected to the second input of the operational amplifier;
a fourth sample switch, connected between an input and the first plate of the second sample capacitor, and clocked by the first clock phase;
a fifth sample switch, connected between the input and the first plate of the second reference capacitor, and clocked by the first clock phase;
a sixth sample switch, connected between the input and the first plate of the second parallel capacitor, and clocked by the first phase; and
a second feedback switch, connected between the output of the operational amplifier and the first plate of the second sample capacitor, and clocked by the second clock phase;
wherein the reference voltage switch circuitry is also connected to the first plate of the second reference capacitor, and to first and second reference voltages;
and wherein the second reference capacitor has a capacitance that is less than a capacitance of the second sample capacitor by the factor.

12. The multiplying DAC of claim 11, wherein the reference voltage switch circuitry is for applying a selected differential reference voltage across the first plate of the first reference capacitor and the first plate of the second reference capacitor, responsive to a digital value;
wherein the differential reference voltage is selected from a set of differential reference voltages comprising first and second polarities of a difference between a first reference voltage and a second reference voltage;
wherein the first reference voltage exceeds the first voltage by the factor;
and wherein the second reference voltage exceeds the second voltage by the factor.

13. The multiplying DAC of claim 12, wherein the factor is two.

14. The multiplying DAC of claim 8, wherein the factor is two.

15. A pipelined analog-to-digital converter, comprising:
a plurality of pipeline stages connected in series, a first one of the pipeline stages connected to an analog input, each of the pipeline stages having a digital output, and having a residue output coupled in sequence to a next pipeline stage in the series;
a digital correction circuit, coupled to the digital output of each of the plurality of pipeline stages, for generating digital data corresponding to the analog input; and
a reference voltage generator, for generating a reference voltage;
wherein each of the plurality of pipeline stages comprises:
a sample-and hold circuit, connected to the input of the pipeline stage;
an analog-to-digital converter, for digitizing a voltage at the output of the sample-and-hold circuit and presenting a digital value at the digital output of the pipeline stage; and
a multiplying digital-to-analog converter (DAC), comprising:
an operational amplifier, having first and second inputs, and having an output for presenting the residue signal of the pipeline stage over an output range between first and second output level voltages responsive to signals received at the first and second inputs;
a first sampling capacitor circuit, comprising a first sample capacitor, for receiving an input voltage corresponding to the output of the sample-and-hold circuit and storing the input voltage at the first sample capacitor in a first clock phase, the first sampling capacitor circuit having an output coupled to a first input of the operational amplifier;
a first feedback switch, connected between the output of the operational amplifier and the first sample capacitor, for connecting the first sample capacitor in a feedback loop in a second clock phase; and
a first reference capacitor circuit, comprising:
a first reference capacitor, coupled to the first input of the operational amplifier;
a first parallel capacitor, coupled to the first input of the operational amplifier;
clocked switches, for coupling the input voltage to the first reference capacitor and the first parallel capacitor in the first clock phase; and
switch circuitry, for charging the first reference capacitor with the reference voltage in the second clock phase;
wherein the reference voltage exceeds the first output level voltage by a factor;
and wherein the first reference capacitor having a capacitance less than a capacitance of the first sample capacitor by the factor.

16. The pipelined ADC of claim 15, wherein the first reference capacitor has a first plate, and has a second plate connected to the first input of the operational amplifier;
and wherein the switch circuitry comprises:
a first reference switch, connected between the reference voltage and the first plate of the first reference capacitor, for connecting the first plate of the first reference capacitor to the reference voltage in the second clock phase.

17. The pipelined ADC of claim 16, wherein switch circuitry is for connecting the first plate of the first reference capacitor to a first reference voltage or a second voltage, responsive to the digital value from the analog-to-digital converter in the pipeline stage;
wherein the first and second reference voltages are generated by the reference voltage generator so that the first reference voltage exceeds the first output level voltage by the factor, and so that the second reference voltage exceeds the second output level voltage by the factor.

18. The pipelined ADC of claim 17, wherein the first and second reference voltages exceed the first and second output level voltages, respectively, relative to a midpoint voltage between the first and second reference voltages.

19. The pipelined ADC of claim 18, wherein the factor is two.

20. The pipelined ADC of claim 15, wherein the operational amplifier is a differential operational amplifier and the output of the operational amplifier comprises first and second outputs;
wherein the first feedback switch is connected between the first output of the operational amplifier and the first sample capacitor;
wherein the input voltage is a differential voltage across first and second input lines, the first sampling capacitor circuit receiving the input voltage at the first input line;
and further comprising:
a second sampling capacitor circuit, comprising a second sample capacitor, for receiving an input voltage at the second input line and storing the input voltage at the second sample capacitor in the first clock phase, the second sampling capacitor circuit having an output coupled to the second input of the operational amplifier;
a second feedback switch, connected between the second output of the operational amplifier and the second sample capacitor, for connecting the second sample capacitor in a feedback loop in the second clock phase; and
a second reference capacitor circuit, comprising:
a second reference capacitor, coupled to the second input of the operational amplifier;
a second parallel capacitor, coupled to the second input of the operational amplifier; and
clocked switches, for coupling the input voltage at the second input line to the second reference capacitor and the second parallel capacitor in the first clock phase;
and wherein the switch circuitry is also for receiving a reference voltage that exceeds the second output level voltage by a factor, and for charging the second reference capacitor with the reference voltage in the second clock phase, the second reference capacitor having a capacitance less than a capacitance of the second sample capacitor by the factor.

* * * * *